(12) United States Patent
Miu et al.

(10) Patent No.: US 7,649,771 B2
(45) Date of Patent: Jan. 19, 2010

(54) METHOD FOR DECREASING PROGRAM DISTURB IN MEMORY CELLS

(75) Inventors: Kenneth Miu, Fremont, CA (US); Leong Seng Tan, Shanghai (CN); Can Zhong, Shanghai (CN); Jianchang Liu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 290 days.

(21) Appl. No.: 11/875,822

(22) Filed: Oct. 19, 2007

(65) Prior Publication Data

US 2008/0151667 A1 Jun. 26, 2008

(30) Foreign Application Priority Data

Dec. 21, 2006 (CN) .................... 2006 1 0147709

(51) Int. Cl.
*G11C 11/34* (2006.01)
*G11C 16/04* (2006.01)
*G11C 16/06* (2006.01)

(52) U.S. Cl. ............................. 365/185.02; 365/185.18; 365/185.19; 365/185.24; 365/185.26; 365/185.28

(58) Field of Classification Search ............ 365/185.02, 365/185.18, 185.19, 195.24, 185.26, 185.28
See application file for complete search history.

(56) References Cited

U.S. PATENT DOCUMENTS

| | | | | |
|---|---|---|---|---|
| 5,920,517 A | * | 7/1999 | Wendell | 365/226 |
| 5,959,883 A | * | 9/1999 | Brennan et al. | 365/185.03 |
| 7,227,783 B2 | * | 6/2007 | Li | 365/185.18 |
| 2005/0068823 A1 | * | 3/2005 | Inoue | 365/202 |
| 2008/0151666 A1 | * | 6/2008 | Miu et al. | 365/206 |

* cited by examiner

*Primary Examiner*—Ly D Pham
(74) *Attorney, Agent, or Firm*—Squire, Sanders & Dempsey, L.L.P.

(57) ABSTRACT

The present invention provides a method for decreasing program disturb in memory cells, comprising: finding an initial programming condition that ensures programming memory cell normally; selecting two parameters from the initial programming condition as variables for a program disturb test; performing the program disturb test to the memory cell for at least two combined values of the variables; obtaining a programming condition with minimum program disturb based on the result of the program disturb test; and applying the programming condition with minimum program disturb as the programming condition for memory cell. The method according to the present invention can minimize the program disturb in memory cells and can be performed easily.

9 Claims, 5 Drawing Sheets

US 7,649,771 B2

METHOD FOR DECREASING PROGRAM DISTURB IN MEMORY CELLS

This application claims the priority of Chinese Patent Application No. 200610147709.X, filed Dec. 21, 2006, the entire disclosure of which is incorporated herein by reference.

FIELD OF THE INVENTION

The present invention relates to semiconductor memory cell, and in particular to a method for decreasing program disturb in memory cells.

BACKGROUND OF THE INVENTION

Non-volatile memory device consists of memory cell array including word lines and bit lines. In general, FET (field effect transistor) is a basic element of the memory cell. The word line connects gates of the transistors and the bit line connects drains of the transistors. A programming operation for a selected memory cell can be performed by floating certain word line and bit line. However, when it is desired to program the selected memory cell during application, the unselected memory cells connected to the same word line and adjacent to the selected memory cell may be programmed also. Such a phenomenon is called "program disturb".

The U.S. Pat. No. 6,469,933 discloses a method for decreasing program disturb in memory cells. When memory cell array is programmed, a ground voltage is applied to the bit line of the memory cell to be programmed, while a high voltage is applied to the bit line of the adjacent memory cells needless to be programmed, thus forming a complementary bit line to decrease the program disturb. The basic principle of the above method is to decrease program disturb by controlling the programming operation of memory cell. Thus, it is necessary to control not only the bit line voltage of the memory cell needed to be programmed, but also the bit line voltage of memory cells needless to be programmed. Therefore, it is not easy to operate.

SUMMARY OF THE INVENTION

An object of the present invention is to provide a method for decreasing program disturb in memory cells easily.

The embodiments of the present invention provide a method for decreasing program disturb in memory cells, comprising:

finding an initial programming condition that can ensure programming a memory cell normally;

selecting two parameters from the initial programming condition as variables for a program disturb test;

performing the program disturb test to the memory cell for at least two combined values of the two variables;

obtaining a programming condition with minimum program disturb based on a result of the program disturb test; and applying the programming condition with minimum program disturb as programming condition during programming the memory cell.

The present invention has following advantages over the prior art: the program disturb is minimized by obtaining the programming condition with minimum program disturb according to the result of the program disturb test, and then applying the programming condition with minimum program disturb on the premise of programming the memory cell normally; and such an operation is very easy because no additional control is required during the programming.

DETAILED DESCRIPTION OF THE EMBODIMENTS

Figure 1:
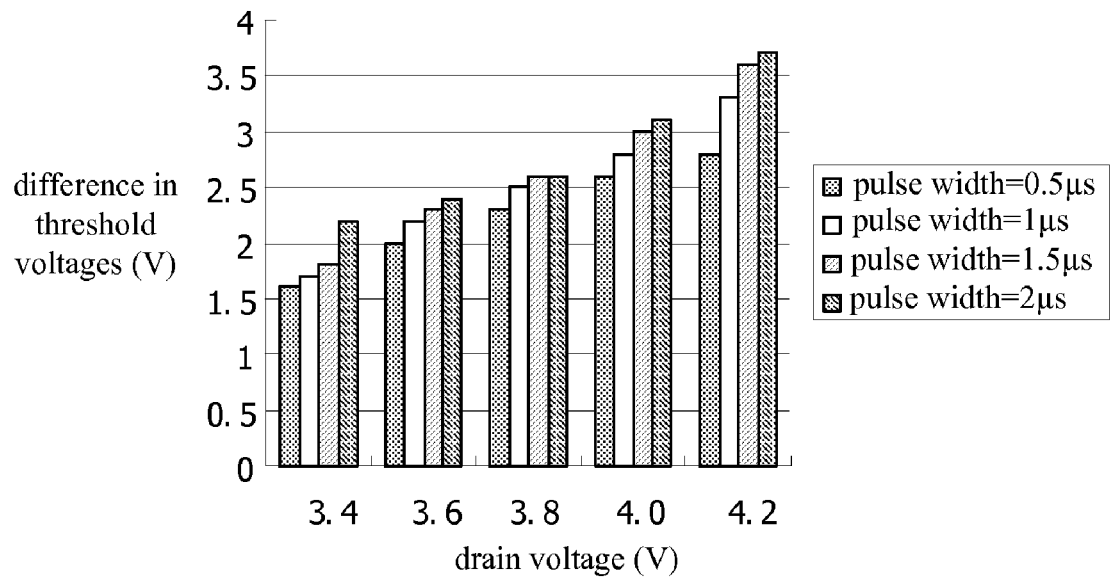
FIG. 1 is a histogram illustrating a result of finding an initial programming condition that can ensure programming memory cell normally according an embodiment of the present invention.

A method for decreasing program disturb in memory cells according to the present invention can minimize program disturb in memory cells during programming a memory cell by obtaining a programming condition with minimum program disturb through a program disturb test, and then applying the programming condition with minimum program disturb to the memory cell, comprising:

finding an initial programming condition that can ensure programming memory cell normally at step s1;

selecting two parameters from the initial programming condition as variables for a program disturb test at step s2;

performing the program disturb test to a memory cell for at least two different combined values of the two variables at step s3;

obtaining a programming condition with minimum program disturb based on a result of the program disturb test at step s4; and applying the programming condition with minimum program disturb as programming condition during programming at step s5.

The step of finding an initial programming condition that can ensure programming memory cell normally includes the following steps:

measuring an initial threshold voltage of transistor in the memory cell at step s11;

at step s12, programming the memory cell by keeping base of the transistor in the memory cell being grounded, floating the source, applying a voltage of 10V and with a pulse width of 0.5 µs to gate, and applying a pulse voltage with a pulse width of 0.5 µs and having one pulse to drain and then setting the drain voltage;

measuring the threshold voltage of the transistor in the memory cell again at step s13;

determining whether a difference in the threshold voltages is larger than a nominal value of the transistor in the memory cell at step s14;

at step s15, performing an erase operation to the memory cell to drop the threshold voltage of the transistor in the memory cell to the initial value if the difference in the threshold voltages is smaller than the nominal value and hence the set drain voltage is unable to program the memory cell normally, and then returning to step s12;

at step s16, performing an erase operation to the memory cell to drop the threshold voltage of the transistor in the memory cell to the initial value if the difference in the threshold voltages reaches the nominal value and hence the set drain voltage can ensure programming the memory cell normally;

recording at least two drain voltages and the number of pulses and the pulse width thereof, the source voltage, the base voltage and the gate voltage capable of programming the memory cell normally as the initial programming condition at step s17.

Preferably, the parameters comprise pulse width and the number of pulses.

Preferably, the nominal value is 2V.

Preferably, the drain voltage at which the memory cell can be programmed normally is 3.6V, 3.8V, 4.0V and 4.2V.

Preferably, the initial programming condition is as follows: the base of the transistor in the memory cell is grounded, the source is floated, a voltage of 10V is applied to the gate, and a pulse voltage of 3.6V, 3.8V, 4.0V or 4.2V is applied to the drain, the pulse voltage having a pulse width of 0.5 µs and one pulse.

The program disturb test includes the following steps:

programming the memory cell by setting the combined variables and keeping other parameters in the initial programming condition unchanged at step s31;

measuring and recording the program disturb at step s32;

determining whether other combined values to be set to the variables remain at step s33;

returning to step s31 if other combined values to be set to the variables remain;

otherwise, completing the disturb test.

The programming condition with minimum program disturb is a set of values corresponding to each program parameter capable of minimizing the program disturb in memory cells.

The combined values for the variables are as follows: the number of pulses is one and the pulse width is 0.5 µs, the number of pulses is one and the pulse width is 1 µs, the number of pulses is one and the pulse width is 1.5 µs, the number of pulses is one and the pulse width is 2 µs, the number of pulses is two and the pulse width is 1 µs and the number of pulses is two and the pulse width is 2 µs.

Figure 4:
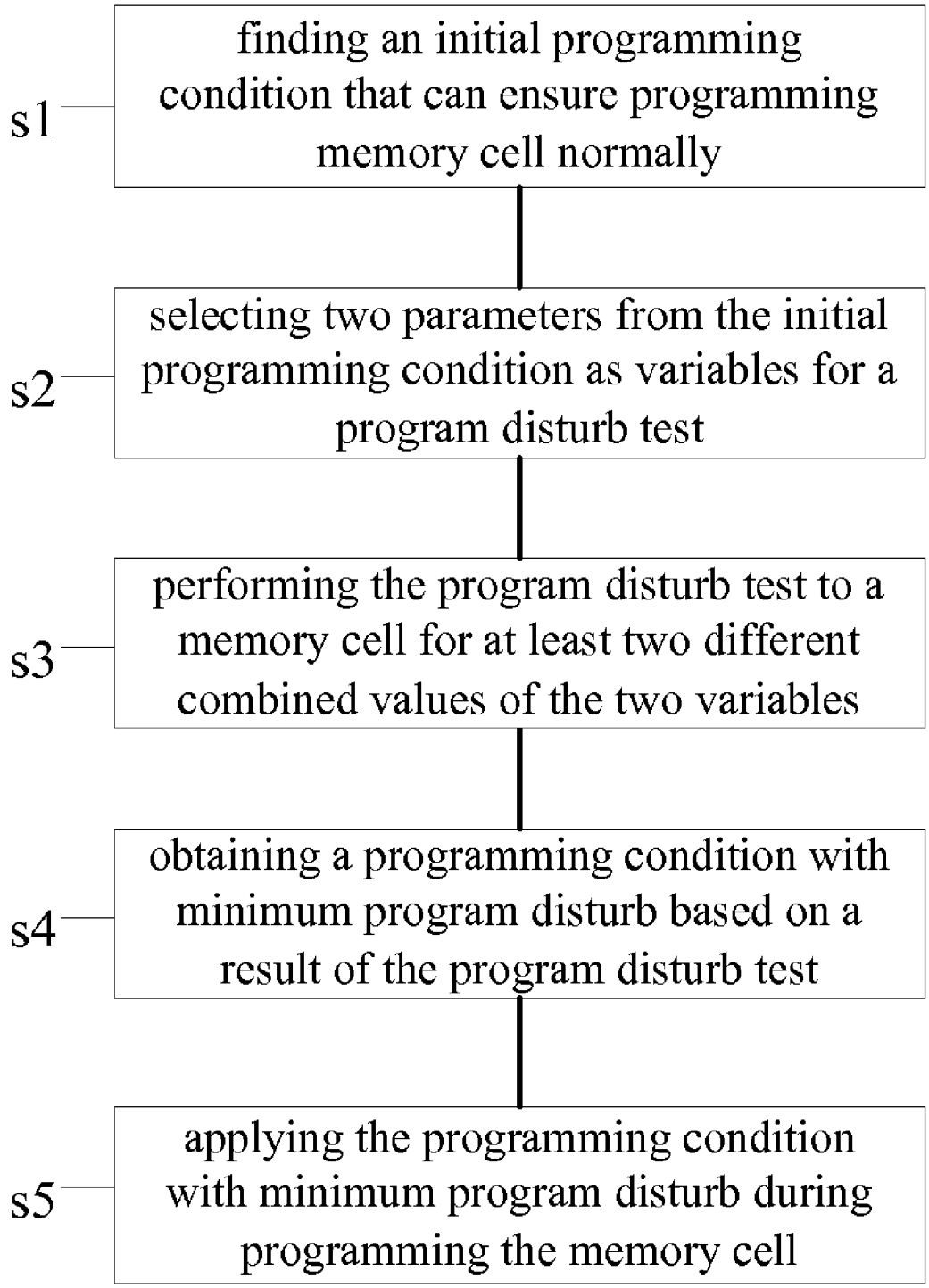
FIG. 4 is a flow chart showing a method for decreasing program disturb in memory cells according to an embodiment of the present invention.

Referring to FIG. 4, a method for decreasing program disturb in memory cells according to the present invention will be described in detail below.

Figure 5:
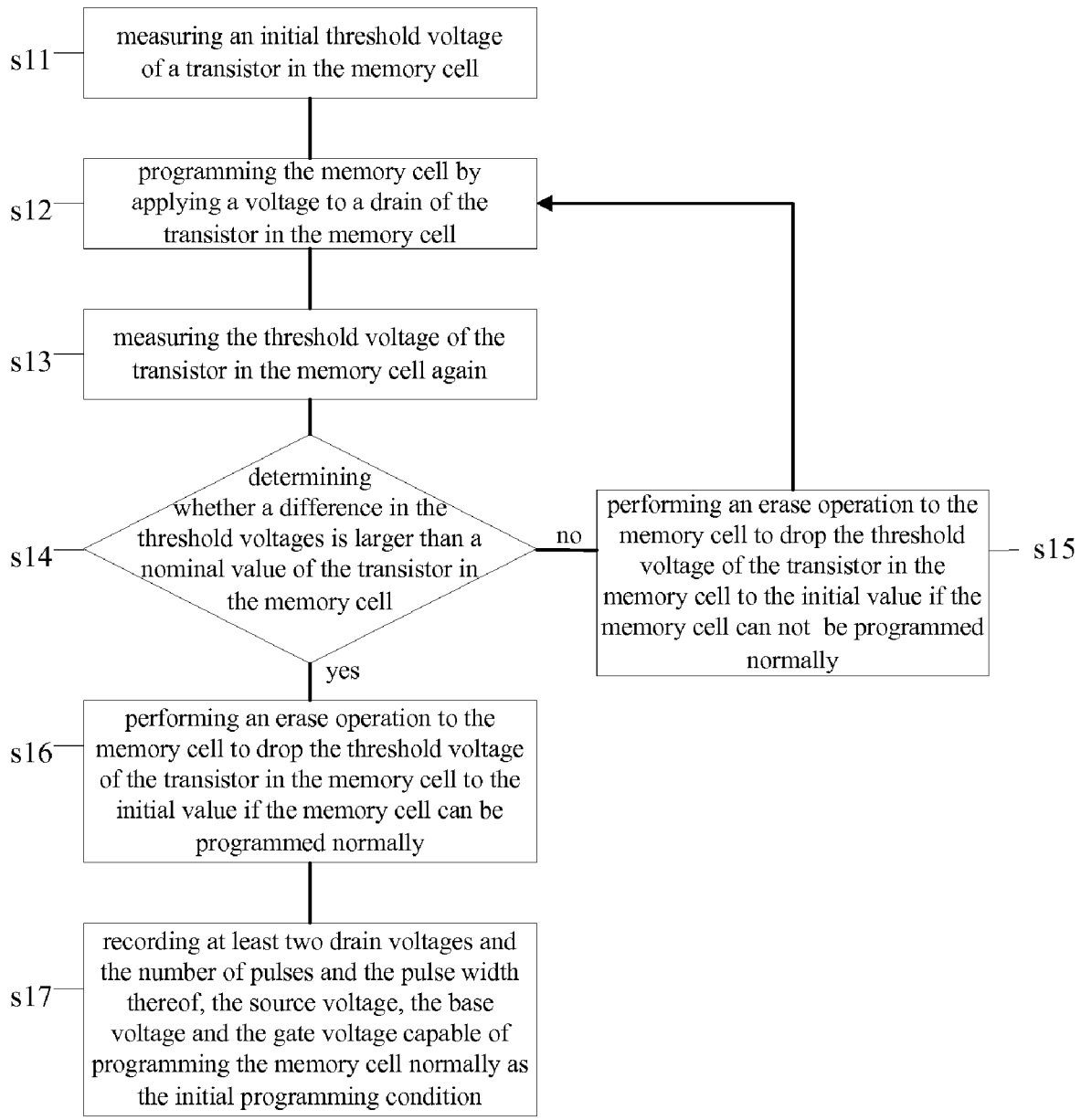
FIG. 5 is a flow chart showing a method of finding the initial programming condition that can ensure programming memory cell normally.

In the first stage, an initial programming condition that can ensure programming the memory cell normally is found as show in FIG. 5, in which:

firstly, measuring an initial threshold voltage of the transistor in the memory cell;

then, performing a programming operation to the memory cell by keeping the base of the transistor in the memory cell being grounded, floating the source, applying a voltage of 10V to the gate, and applying a pulse voltage of 3.4V to the drain, the pulse voltage having a pulse width of 0.5 µs and one pulse;

measuring the threshold voltage of the memory cell again after completing the programming operation;

obtaining a difference in the threshold voltages by subtracting the initial threshold voltage from the threshold voltage measured later, and determining whether the difference in the threshold voltages is larger than 2V;

as shown in FIG. 1, the difference in the threshold voltages does not reach 2V when the drain voltage is 3.4V, that is, the memory cell can't be programmed normally when the drain voltage is 3.4V, and an erase operation is performed to the memory cell to drop the threshold voltage to the initial value, so as to ensure that subsequent programming operations may be performed at same voltage, thus improving the accuracy of the measurement;

next, performing a programming operation to the memory cell by keeping the base of the transistor in the memory cell being grounded, floating the source, applying a voltage of 10V to the gate, and applying a pulse voltage of 3.6V to the drain, the pulse voltage having a pulse width of 0.5 µs and one pulse;

as shown in FIG. 1, the difference in the threshold voltages reaches 2V when the drain voltage is 3.6V, that is, the memory cell can be programmed normally when the drain voltage is 3.6V, and an erase operation is performed to the memory cell to drop the threshold voltage to the initial value;

next, programming the memory cell when the base is grounded, the source is floated, a voltage of 10V is applied to the gate, and a pulse voltage with a pulse width of 0.5 µs and having one pulse is applied to the drain, and then the drain voltage is set to 3.8V, 4.0V and 4.2V, respectively (as shown in FIG. 1, the memory cell can be programmed normally when the drain voltage is 3.8V, 4.0V or 4.2V); then, recording the drain voltages of 3.6V, 3.8V, 4.0V and 4.2V, the source voltage, the grounded base and the gate voltage as the initial programming condition, that is, the initial programming condition including that the base is grounded, the source is floated, a voltage of 10V is applied to the gate, and a pulse voltage of 3.6V 3.8V, 4.0V and 4.2V is applied to the drain respectively.

In the second stage, the pulse width and the number of pulses are selected from the initial programming condition as variables.

Figure 6:
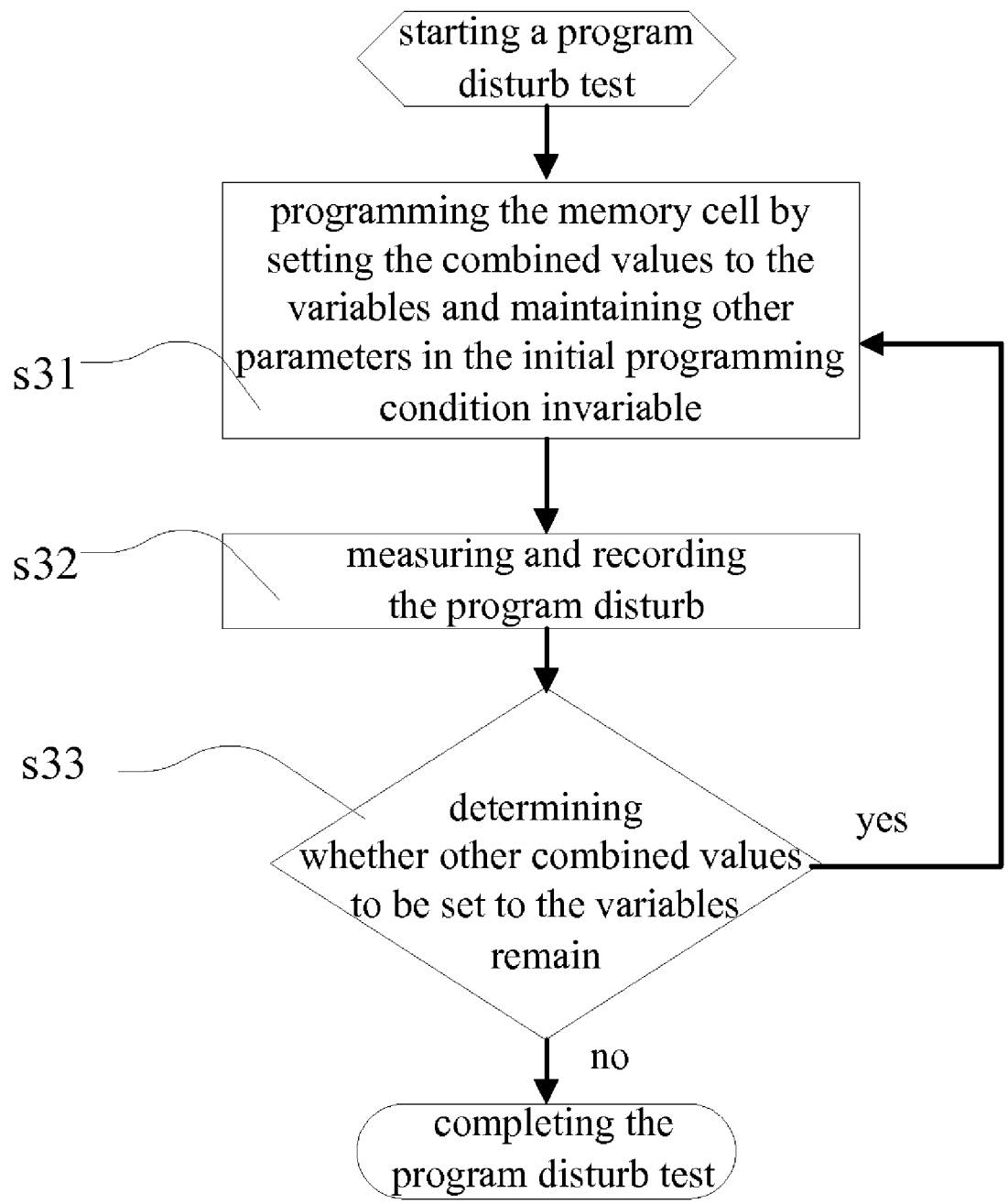
FIG. 6 is a flow chart showing the program disturb test.

As shown in FIG. 6, in the third stage, the program disturb test is performed to the memory cell when the combined values are as follows: the number of pulses is one and the pulse width is 0.5 µs, the number of pulses is one and the pulse width is 1 µs, the number of pulses is one and the pulse width is 1.5 µs, the number of pulses is one and the pulse width is 2 µs, the number of pulses is two and the pulse width is 1 µs and the number of pulses is two and the pulse width is 2 µs, respectively.

Firstly, performing the programming operation to the memory cell and measuring and recording the program disturb when the base is grounded, the source is floated, a voltage of 10V and with a pulse width larger than 0.5 µs is applied to the gate and a pulse voltage of 3.6V is applied to the drain, the pulse voltage having a pulse width of 0.5 µs and one pulse; then, performing the programming operation to the memory cell and measuring and recording the program disturb when only the drain voltage is changed while other parameters are not changed, i.e., the source is floated, the base is grounded, a voltage of 10V and with a pulse width of 0.5 µs is applied to the gate but a pulse voltage of 3.8V is applied to the drain, the pulse voltage having a pulse width of 0.5 µs and one pulse; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Then, performing the programming operation to the memory cell and measuring and recording the program disturb when the base is grounded, the source is floated, a voltage of 10V and with a pulse width larger than 1 µs is applied to the gate and a pulse voltage of 3.6V is applied to the drain, the pulse voltage having a pulse width of 1 µs and one pulse; then, performing the programming operation to the memory cell and measuring and recording the program disturb when only the drain voltage is changed while other parameters are not changed, i.e., the source is floated, the base is grounded, a voltage of 10V and with a pulse width of 1 µs is applied to the gate but a pulse voltage of 3.8V is applied to the drain, the pulse voltage having a pulse width of 1 µs and one pulse; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Next, performing the programming operation to the memory cell and measuring and recording the program disturb when the base is grounded, the source is floated, a voltage of 10V and with a pulse width larger than 1.5 µs is applied to the gate and a pulse voltage of 3.6V is applied to the drain, the pulse voltage having a pulse width of 1.5 µs and one pulse; then, performing the programming operation to the memory cell and measuring and recording the program disturb when only the drain voltage is changed while other parameters are not changed, i.e., the source is floated, the base is grounded, a voltage of 10V and with a pulse width of 1.5 µs is applied to the gate but a pulse voltage of 3.8V is applied to the drain, the pulse voltage having a pulse width of 1.5 µs and one pulse; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Next, performing the programming operation to the memory cell and measuring and recording the program disturb when the base is grounded, the source is floated, a voltage of 10V and with a pulse width larger than 2 µs is applied to the gate and a pulse voltage of 3.6V is applied to the drain, the pulse voltage having a pulse width of 2 µs and one pulse; then, performing the programming operation to the memory cell and measuring and recording the program disturb when only the drain voltage is changed while other parameters are not changed, i.e., the source is floated, the base is grounded, a voltage of 10V and with a pulse width of 2 µs is applied to the gate but a pulse voltage of 3.8V is applied to the drain, the pulse voltage having a pulse width of 2 µs and one pulse; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Next, performing the programming operation to the memory cell and measuring and recording the program disturb when the base is grounded, the source is floated, a voltage of 10V and with a pulse width larger than 1 µs is applied to the gate and a pulse voltage of 3.6V is applied to the drain, the pulse voltage having a pulse width of 1 µs and two pulses; then, performing the programming operation to the memory cell and measuring and recording the program disturb when only the drain voltage is changed while other parameters are not changed, i.e., the source is floated, the base is grounded, a voltage of 10V and with a pulse width of 1 µs is applied to the gate but a pulse voltage of 3.8V is applied to the drain, the pulse voltage having a pulse width of 1 µs and two pulses; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

At last, performing the programming operation to the memory cell and measuring and recording the program disturb when the base is grounded, the source is floated, a voltage of 10V and with a pulse width larger than 2 µs is applied to the gate and a pulse voltage of 3.6V is applied to the drain, the pulse voltage having a pulse width of 2 µs and two pulses; then, performing the programming operation to the memory cell and measuring and recording the program disturb when only the drain voltage is changed while other parameters are not changed, i.e., the source is floated, the base is grounded, a voltage of 10V and with a pulse width of 2 µs is applied to the gate but a pulse voltage of 3.8V is applied to the drain, the pulse voltage having a pulse width of 2 µs and two pulses; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Figure 2:
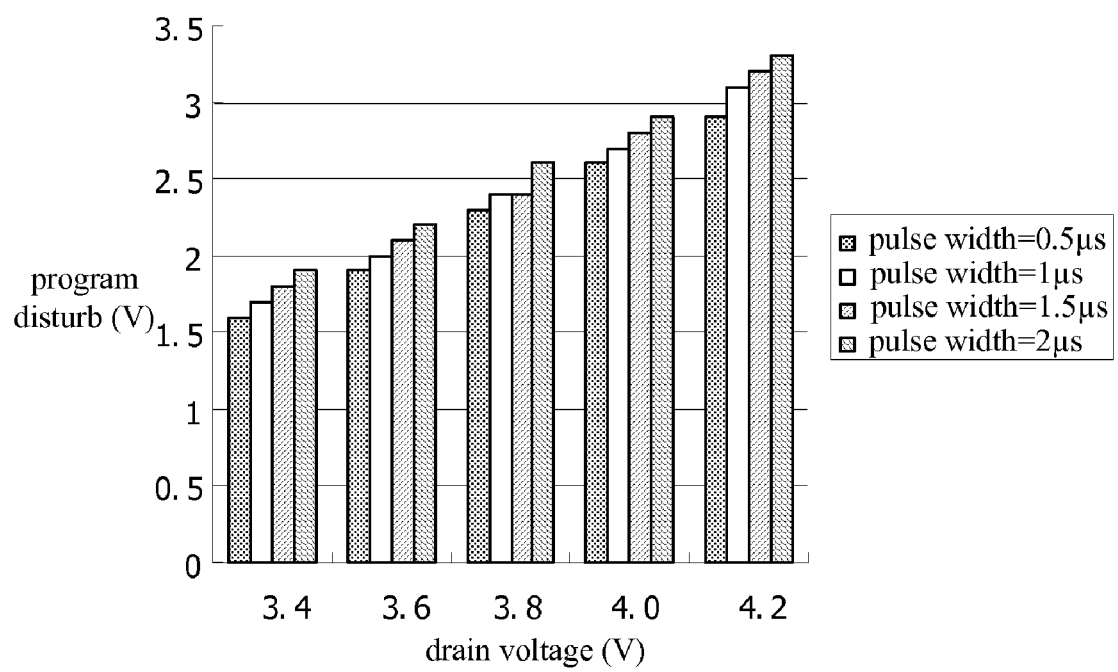
FIG. 2 is a histogram illustrating a tested relationship between the pulse width and the program disturb according an embodiment of the present invention.
Figure 3:
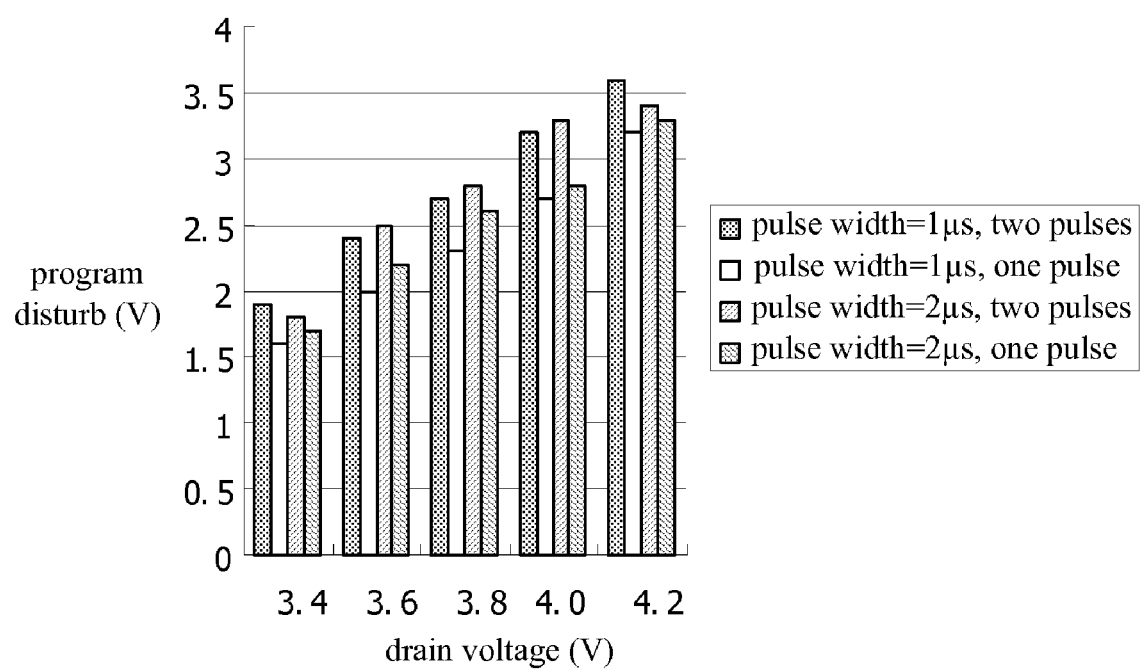
FIG. 3 is a histogram illustrating a tested relationship between the two combined variables comprising the number of pulses and pulse width and the program disturb according an embodiment of the present invention.

As shown in FIG. 2, the program disturb increases with the pulse width in the case that the number of pulses is one. However, as shown in FIG. 3, the program disturb decreases with the number of pulses when the pulse width of the drain voltage applied to the transistor in the memory cell is fixed.

In the fourth stage, the program disturb can be minimized by applying a pulse voltage having a pulse width of 1 µs and one pulse to the drain of the transistor in the memory cell during programming the memory cell based on the above result. Thus, the programming condition with minimum program disturb includes applying a pulse voltage having a pulse width of 1 µs and one pulse to the drain of the transistor in the memory cell.

In the fifth stage, the pulse voltage having the pulse width of 1 µs and one pulse is applied to the drain of the transistor in the memory cell during programming the memory cell.

Hence, in the method for decreasing program disturb in memory cells according to the present invention, the program disturb can be minimized by obtaining the programming condition with minimum program disturb based on the result of the program disturb test, and then applying the program disturb condition with minimum program disturb on the premise of programming the memory cell normally; and such an operation is easy since no additional control is required during the programming.

What is claimed is:

1. A method for decreasing program disturb in memory cells, comprising:
    finding an initial programming condition that ensures programming a memory cell normally;
    selecting two parameters from the initial programming condition as variables for a program disturb test;
    performing the program disturb test to the memory cell for at least two combined values of the variables;
    obtaining a programming condition with minimum program disturb based on a result of the program disturb test; and
    applying the programming condition with minimum program disturb during programming the memory cell.

2. The method according to claim 1, wherein the step of finding an initial programming condition that ensures programming the memory cell normally includes:
    measuring an initial threshold voltage of transistor in the memory cell;
    performing a programming operation to the memory cell by keeping a base of the transistor in the memory cell being grounded and a source of the transistor in the memory cell being floated, applying a voltage of 10V to a gate, and applying a pulse voltage of by to a drain of the transistor in the memory cell, the pulse voltage having one pulse and a pulse width of 0.5 µs;
    measuring the threshold voltage of the transistor in the memory cell again;
    determining whether a difference in the threshold voltages is larger than a nominal value of the transistor in the memory cell;
    performing an erase operation to the memory cell to drop the threshold voltage of the transistor in the memory cell to the initial voltage if the difference in the threshold voltages is smaller than the nominal value and hence the memory cell is unable to be programmed normally, and then returning to the step of performing a programming operation;
    performing the erase operation to the memory cell to drop the threshold voltage of the transistor in the memory cell to the initial voltage if the difference in the threshold voltages reaches the nominal value and hence the set drain voltage is able to program the memory cell normally; and
    recording at least two drain voltages and the number of pulses and the pulse width thereof, the source voltage, the base voltage and the gate voltage capable of programming the memory cell normally as the initial programming condition.

3. The method according to claim 1, wherein the parameters comprise pulse width and the number of pulses.

4. The method according to claim 1, wherein the program disturb test includes the following steps:
    programming the memory cell by setting combined values for the variables and maintaining other parameters in the initial programming condition unchanged;
    measuring and recording the program disturb;
    determining whether other combined values to be set to the variables remain;
    returning to the step of programming the memory cell if other combined values to be set to the variables remain; otherwise, completing the disturb test.

5. The method according to claim 1, wherein the programming condition with minimum program disturb is a set of values corresponding to each program parameter capable of minimizing the program disturb in memory cells.

6. The method according to claim 2, wherein the nominal value is 2V.

7. The method according to claim 2, wherein the drain voltage at which the memory cell is programmed normally is 3.6V, 3.8V, 4.0V and 4.2V.

8. The method according to claim 2, wherein the initial programming condition is as follows: the base of the transistor in the memory cell is grounded, the source is floated, a voltage of 10V is applied to the gate, and a pulse voltage of 3.6V, 3.8V, 4.0V or 4.2V is applied to the drain, the pulse voltage having a pulse width of 0.5 µs and one pulse.

9. The method according to claim 4, wherein the combined values for the variables are as follows: the number of pulses is one and the pulse width is 0.5 µs, the number of pulses is one and the pulse width is 1 µs, the number of pulses is one and the pulse width is 1.5 µs, the number of pulses is one and the pulse width is 2 µs, the number of pulses is two and the pulse width is 1 µs and the number of pulses is two and the pulse width is 2 µs.

* * * * *